United States Patent [19]

Thapar et al.

[11] Patent Number: 5,753,938
[45] Date of Patent: May 19, 1998

[54] STATIC-INDUCTION TRANSISTORS HAVING HETEROJUNCTION GATES AND METHODS OF FORMING SAME

[75] Inventors: Naresh I. Thapar; Praveen Muraleedharan Shenoy; Bantval Jyant Baliga, all of Raleigh, N.C.

[73] Assignee: North Carolina State University, Raleigh, N.C.

[21] Appl. No.: 694,276

[22] Filed: Aug. 8, 1996

[51] Int. Cl.$^6$ .................... H01L 29/161; H01L 29/808
[52] U.S. Cl. ..................... 257/77; 257/136; 257/192; 257/264
[58] Field of Search ............... 257/77, 136, 192, 257/264, 266, 267

[56] References Cited

U.S. PATENT DOCUMENTS

| | | | |
|---|---|---|---|
| 4,375,124 | 3/1983 | Cogan | 257/264 |
| 4,484,207 | 11/1984 | Nishizawa et al. | 257/192 |
| 4,587,712 | 5/1986 | Baliga | 257/136 |
| 4,757,028 | 7/1988 | Kondoh et al. | 437/40 |
| 5,323,040 | 6/1994 | Baliga | 257/332 |
| 5,396,085 | 3/1995 | Baliga | 257/77 |
| 5,406,096 | 4/1995 | Malhi | 257/114 |
| 5,436,174 | 7/1995 | Baliga et al. | 437/22 |
| 5,536,953 | 7/1996 | Dreifus et al. | 257/77 |
| 5,612,547 | 3/1997 | Clarke et al. | 257/77 |

OTHER PUBLICATIONS

R.R. Siergiej et al., *High Power 4H–SiC Static Induction Transistors*, IEDM, pp. 353–356 (1995).

B. Jayant Baliga, *Power Rectifiers*, Chapters 4, Power Semiconductor Devices, PWS Publishing, pp. 128–143 (1996).

N.A. Papanicolaou et al., *Pt and PTSi$_x$ Schottky Contacts On N-type β–SiC*, J. Appl. Phys., vol. 65, No. 9, pp. 3526–3530, May (1989).

J.N. Su et al., *Fabrication of High Voltage SiC Schottky Barrier Diodes by Ni Metallization*, Inst. Phys. Conf. Ser. No. 142, Chapter 4, Silicon Carbide and Related Materials Conference, Kyoto, Japan, pp. 697–700 (1995).

(List continued on next page.)

*Primary Examiner*—Gene M. Munson
*Attorney, Agent, or Firm*—Myers, Bigel, Sibley & Sajovec

[57] ABSTRACT

A semiconductor switching device includes a plurality of adjacent heterojunction-gate static-induction transistor (SIT) unit cells connected in parallel in a monocrystalline silicon carbide substrate having first and second opposing faces, a relatively highly doped silicon carbide drain region adjacent the first face and a relatively highly doped silicon carbide source region adjacent the second face. A relatively lightly doped drift region is also provided in the substrate and extends between the drain region and source region. A plurality of trenches are also provided in the substrate so that sidewalls of the trenches extend adjacent the drift region. Each trench preferably contains a relatively highly doped second conductivity type nonmonocrystalline silicon gate region comprised of a material selected from the group consisting of polycrystalline silicon or amorphous silicon. These gate regions form P-N heterojunctions with the drift region at the sidewalls and bottoms of the trenches. An electrically insulating layer, such as a thermally grown silicon dioxide layer, is also provided on the nonmonocrystalline silicon gate regions in order to electrically insulate the gate regions from metallization on the second face. The use of nonmonocrystalline materials for the gate regions is preferred because the nonmonocrystalline lattice structure of the gate regions provides numerous grain boundaries and other lattice defects which act as scattering sites for electrons. By providing scattering sites, the probability that accelerated electrons will reach the threshold energy to induce avalanche breakdown in the gate regions is reduced and an increase in forward blocking voltage capability is achieved. Hole injection from the P+ polycrystalline silicon gate region into the N-type drift region can also be suppressed to significantly improve the switching speed by reducing the amount of stored charge in the drift region.

5 Claims, 4 Drawing Sheets

OTHER PUBLICATIONS

I.A. Blech et al., *Optimization of Al Step Coverage Through Computer Simulation and Scanning Electron Microscopy*, J. Vac. Sci. Technol., vol. 15, No. 1, pp. 13–19 (1978).

M. Kothandaraman et al., *Reactive Ion Etching of Trenches in 6H–SiC*, Journal of Electronic Materials, vol. 25, No. 5, pp. 857–878 (1996).

T.I. Kamins, *Oxidation of Phosphorus–Doped Low Pressure and Atmospheric Pressure CVD Polycrystalline–Silicon Films*, Journ. Electrochem. Soc., Solid–State Science and Technology, pp. 838–844 May (1979).

A.K. Agarwal et al., *A Critical Look at the Performance Advantages and Limitations of 4H–SiC Power UMOSFET Structures*, Proceedings to the 8th International Symposium on Power Semiconductor Devices and ICs, pp. 119–122 (1996).

Hideo Sunami, *Thermal Oxidation of Phosphorus–Doped Polycrystalline Silicon in Wet Oxygen*, Journ. Electrochem. Soc., Solid–State Science and Technology, vol. 125, No. 6, pp. 892–897.

J.B. Petit et al., *Thermal Oxidation of Single–Crystal Silicon Carbide: Kinetic, Electrical, and Chemical Studies*, Amorphous and Crystalline Silicon Carbide IV, Springer Proceedings in Physics, vol. 71, pp. 190–196 (1992).

STATIC-INDUCTION TRANSISTORS HAVING HETEROJUNCTION GATES AND METHODS OF FORMING SAME

FIELD OF THE INVENTION

The present invention relates to semiconductor devices and fabrication methods, and more particularly to semiconductor devices for high power applications and methods of forming same.

BACKGROUND OF THE INVENTION

Silicon carbide semiconductor devices have generally been considered prime candidates for high power applications because silicon carbide has a wide bandgap, high melting point, low dielectric constant, high breakdown field strength, high thermal conductivity and high saturated electron drift velocity compared to silicon. These characteristics allow silicon carbide power devices to operate at higher temperatures, higher power levels and with lower specific on-resistance than conventional silicon based power devices. One attempt to take advantage of silicon carbide's preferred characteristics is disclosed in commonly assigned U.S. Pat. No. 5,396,085 to Baliga, entitled Silicon Carbide Switching Device with Rectifying Gate, the disclosure of which is hereby incorporated herein by reference. In particular, the '085 patent discloses, among other things, a class of silicon carbide field effect transistor commonly referred to as a static-induction transistor (SIT). As will be understood by those skilled in the art, static-induction transistors can be used as vertical power devices to control high levels of current by controlling the height of an electrostatically induced potential energy barrier in a semiconductor substrate. For example, in an article by Siergiej et al. entitled High Power 4H-SiC Static Induction Transistor, IEDM, pp. 353–356 (1995), a 225 Watt normally-on silicon carbide static-induction transistor having Schottky metal gate electrodes is disclosed. These Schottky gate electrodes act to pinch-off a conductive channel in a drift region by establishing opposing gate depletion layers which converge and deplete the channel of mobile charge carriers when a sufficiently negative gate bias has been applied.

One of the benefits of using Schottky barrier rectifiers in static-induction transistors is the reduction in hole injection into the drift region of the transistor when the diode formed between the Schottky gate electrode and the drift region is used as a flyback diode. In particular, reducing hole injection during the flyback mode of operation typically improves switching speed and reduces power losses. Notwithstanding this benefit, Schottky barrier rectifiers typically incur relatively large leakage currents at high temperatures which can limit their suitability in many silicon carbide device applications. This limitation on the performance of Schottky rectifiers is more fully described in a textbook by B. J. Baliga entitled Power Semiconductor Devices, PWS Publishing, pp. 137–142 (1995). In addition, typical Schottky metals such as platinum and nickel may become chemically reactive with silicon carbide at moderate to high temperatures. These limitations on the suitability of using metals to form high temperature Schottky barrier rectifying junctions with silicon carbide are more fully described in articles by N. A. Papanicolaou et al. entitled Pt and PtSi$_x$ Schottky Contacts on N-type β-SiC, J.Appl.Phys. Vol. 65, No. 9, pp. 3526–3530, May (1989); and J. N. Su et al. entitled Fabrication of high voltage SiC Schottky Barrier Diodes by Ni Metallization, Inst. Phys. Conf. Ser. No. 142, Chapter 4, Silicon Carbide and Related Materials Conference, Kyoto, Japan, pp. 697–700 (1995). Furthermore, Schottky metal gate electrodes may not always be suitable for silicon carbide devices having trench-gate electrodes because of problems with conformally depositing metal onto sidewalls of trenches having reduced lateral dimensions. The difficulty of obtaining uniform step coverage when depositing metals is more fully described in an article by I. A. Blech entitled Optimization of Al Step Coverage Through Computer Simulation and Scanning Electron Microscopy, J.Vac.Sci.Technol. Vol. 15, No. 1, pp. 13–19 (1978). Finally, steps to insulate metal gate electrodes may also pose difficult problems since metals typically do not form native oxides and adhesion problems often occur when oxides are deposited on metals.

As an alternative to Schottky metal gate electrodes, static induction transistors with JFET gate control, high breakdown voltage and low on-state forward voltage drop have also been proposed. For example, the aforementioned '085 patent to Baliga discloses a static induction transistor at FIG. 11. In this transistor, JFET gate control is provided by a silicon carbide P$^+$-N junction. However, when operated as a flyback diode, the one-sided abrupt P$^+$-N junction typically operates to inject relatively high concentrations of minority carriers (holes) into the N-type drift region. Unfortunately, this minority carrier injection typically compromises switching speed and increases power losses in the transistor.

Thus, notwithstanding the above described attempts to form silicon carbide based static-induction transistors, there still continues to be need for improved static-induction transistors which are suitable for high temperature and high switching speed applications and can be easily fabricated with reduced lateral dimensions to achieve high levels of integration.

SUMMARY OF THE INVENTION

It is therefore an object of the present invention to provide improved static-induction transistors and methods of forming same.

It is another object of the present invention to provide static-induction transistors for high temperature applications and methods of forming same.

It is still another object of the present invention to provide static-induction transistors which can be switched at high speeds and methods of forming same.

It is still a further object of the present invention to provide static-induction transistors which have high blocking voltage capability and low on-state forward voltage drop, and methods of forming same.

These and other objects, features and advantages of the present invention are provided by a power semiconductor device which comprises a plurality of adjacent heterojunction-gate static-induction transistor (SIT) unit cells connected in parallel. In particular, the power device may comprise a monocrystalline silicon carbide substrate having first and second opposing faces, a relatively highly doped silicon carbide drain region adjacent the first face and a relatively highly doped silicon carbide source region adjacent the second face. A relatively lightly doped drift region (e.g., N−) is also provided in the substrate. The drift region extends between the drain and source regions and may form non-rectifying junctions with these regions. The drift region may also form a rectifying junction with the drain region. A plurality of trenches are also formed in the substrate so that the sidewalls and bottoms of the trenches extend adjacent the drift region. The trenches are preferably patterned as a one or two-dimensional array so that pairs of adjacent trenches define mesas therebetween.

To achieve preferred device characteristics, each trench preferably contains a relatively highly doped second conductivity type nonmonocrystalline silicon gate region (e.g., P+) having a doping concentration greater than about 5×10$^8$ cm$^{-3}$ therein. In contrast to vertical MOSFETs, the gate regions are not electrically insulated from the drift region, but instead form rectifying P-N heterojunction diodes with the drift region at the sidewalls and bottoms of the trenches. An electrically insulating layer, comprising thermally grown silicon dioxide or polyimide, may also be provided on the nonmonocrystalline silicon gate regions to electrically insulate the gate regions from metallization on the second face.

To dispose the transistor in a forward blocking mode of operation, the P-type gate regions may be biased negative relative to the source region which is biased negative relative to the drain region. In particular, by establishing a reverse bias across the P-N heterojunctions, the portions of the N-type drift region extending between (and below) adjacent trenches may become fully depleted of majority charge carriers. The depletion of majority carriers from between the trenches (and below) establishes a potential barrier between the source and drain regions which prevents traversal of majority carriers when the drain region is forward biased relative to the source region. To eliminate the potential barrier and provide a forward conduction mode of operation with low on-state voltage drop, the reverse bias across the P-N heterojunctions is removed. In the case of transistor having an N-type drain region, a reverse or flyback mode of operation is also established when the gate region is biased positive relative to the drain region and the P-N heterojunctions are forward biased.

According to a preferred aspect of the present invention, the gate region preferably comprises a material selected from the group consisting of polycrystalline silicon or amorphous silicon, however other materials may be used. The use of nonmonocrystalline materials for the gate regions is preferred because the nonmonocrystalline lattice structure of the gate regions can be utilized to increase the forward blocking voltage capability of the transistor by providing numerous grain boundaries and other lattice defects which act as scattering sites for electrons. During the forward blocking mode of operation, these scattering sites act to deflect and partially absorb the energy of electrons which are being accelerated under the influence of the reverse potential field across the P-N heterojunction. Thus, by providing scattering sites, the probability that accelerated electrons will reach the threshold energy to induce avalanche breakdown in the gate region is reduced. Steps to increase the density of scattering sites can also include implanting electrically inactive ions into the gate regions to increase the density of interstitial lattice defects therein.

According to another preferred aspect of the present invention, the potential barrier for electrons on the drift region side of the P+-N⁻ heterojunction can be maintained at about 1.2 eV if P+ polycrystalline silicon is utilized as the gate material. However, the potential barrier for holes on the P+ gate region side of the heterojunction is maintained at a preferred level which is at least 0.5 eV greater than the potential barrier for the electrons, at about 2.7 eV. Thus, during the flyback mode of operation, negligible hole injection from the P+ polycrystalline silicon gate region into the N-type drift region occurs. The substantial elimination of hole injection into the drift region significantly improves the switching speed of the static-induction transistor by reducing the amount of stored charge in the drift region. Accordingly, the present invention achieves an unexpected advantageous result of limiting conduction in the P⁺-N⁻ heterojunction diode to a single carrier type (electrons), even though the P-type gate region is typically doped at levels more that two orders of magnitude greater than the N-type drift region. In other words, even though an abrupt one-sided P+-N⁻ junction is typically dominated by conduction of holes when forward biased, the present invention utilizes an abrupt one-sided P+-N⁻ heterojunction to achieve a forward conduction current dominated by electrons.

A preferred method of forming the preferred static-induction transistor includes the steps of providing an N+ (or P+) silicon carbide wafer having a relatively lightly doped epitaxial drift region of first conductivity type thereon. A source region of first conductivity type is then formed at a top face of the substrate by implanting dopants into the face. A reactive ion etching (RIE) step is then performed to form a plurality of trenches having sidewalls and bottoms which extend adjacent the drift region. A polycrystalline (or amorphous) silicon layer of second conductivity type is then conformally deposited onto the sidewalls and bottoms of the trenches and on the top face of the substrate. The polycrystalline silicon layer is doped with a suitable P-type dopant such as boron (B) to a level of about $1 \times 10^{19}$ cm$^{-3}$. The polycrystalline silicon layer is then planarized to form separate gate regions in the trenches. The different oxidation rates of polycrystalline silicon and silicon carbide are then used advantageously during the formation of a relatively thick thermally grown oxide on the polycrystalline gate regions and a relatively thin thermally grown oxide on the silicon carbide source regions. A blanket reactive ion etching (RIE) step is then performed to remove the thin oxide on the source regions. Metallization is then applied and patterned to form separate gate, source and drain electrodes.

DESCRIPTION OF PREFERRED EMBODIMENTS

Figure 1:
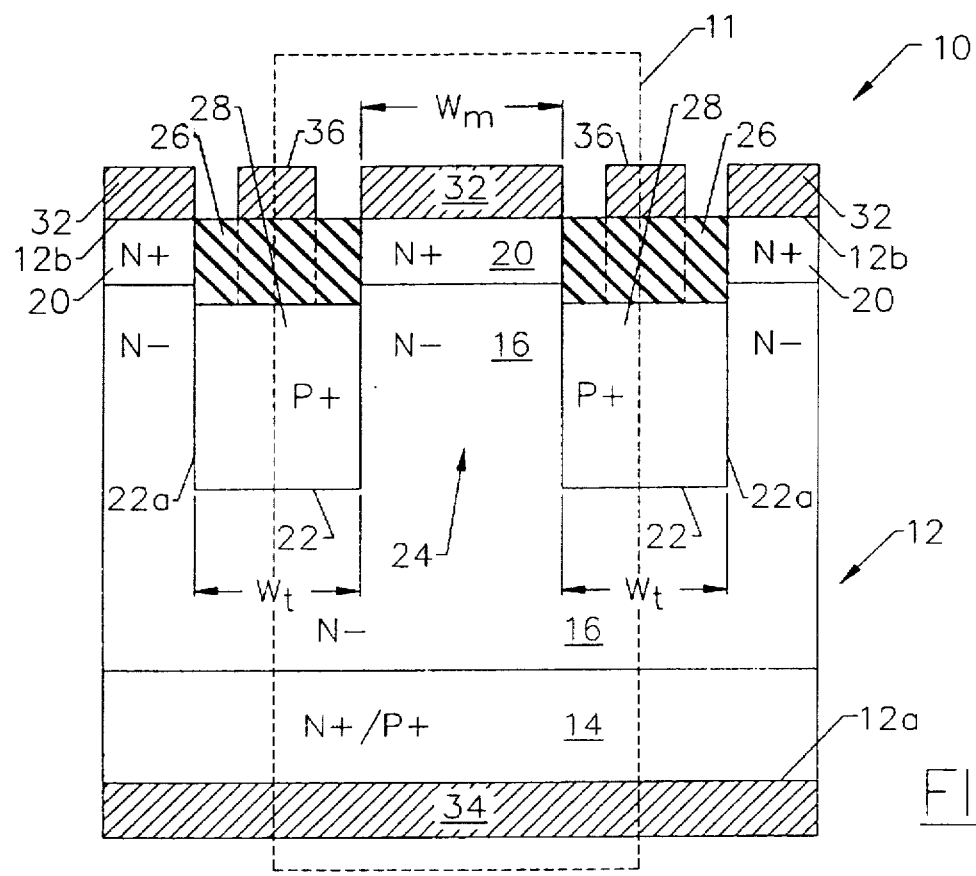
FIG. 1 illustrates a schematic cross-sectional view of an integrated heterojunction-gate static-induction switching device according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Like numbers refer to like elements throughout. Moreover, the terms "first conductivity type" and "second conductivity type" refer to opposite conductivity types such as N or P-type and each embodiment described and illustrated herein includes its complementary embodiment as well.

Referring now to FIG. 1, a cross-sectional illustration of a silicon carbide power device 10 according to an embodiment of the present invention is shown. The power device 10 preferably comprises a plurality 30 of adjacent heterojunction-gate static-induction transistor (SIT) unit cells 11 connected in parallel. As illustrated, the power device 10 may comprise a monocrystalline silicon carbide substrate 12 (e.g., 4H—SiC, 6H—SiC) having first and second opposing faces 12a, 12b. In the substrate 12, a relatively highly doped silicon carbide drain region 14 (shown as N+ or P+) is provided adjacent the first face 12a, and a relatively highly doped silicon carbide source region 20 (shown as N+) is provided adjacent the second face 12b. A relatively lightly doped drift region 16 (shown as N−) is also provided in the substrate 12. The drift region 16 extends between the drain region 14 and source region 20 and may form non-rectifying junctions with these regions, opposite the first and second faces 12a, 12b. The power device 10 may also comprise what is commonly referred to as a static-induction thyristor, if the drain region 14 is of P-type conductivity. This is true, notwithstanding the lack of a P-N-P-N regenerative path in the "thyristor". However, for purposes herein, both devices of FIG. 1 will be referred to as transistors.

A plurality of trenches 22 having width "W," are also preferably formed in the substrate. The trenches 22 may be patterned as parallel stripes extending in a third dimension (not shown) or may be of rectangular, annular or other shape. Each trench 22 includes a sidewall 22a extending adjacent the drift and source regions 16 and 20 and a bottom extending adjacent the drift region 16, as illustrated. Adjacent trenches 22 20 define a mesa 24 having width "$W_m$" therebetween. Each mesa 24 preferably includes a source region 20 and a portion of the drift region 16 extending adjacent the source region 20. Similarly, in the case of an annular-shaped trench, which can be illustrated as a pair of adjacent trenches when viewed in transverse cross-section, each trench defines a mesa 24 within an inner periphery of the trench. However, for purposes herein, opposite sides of an annular-shaped trench will be treated as adjacent trenches 22.

Referring still to FIG. 1, each trench 22 preferably contains a relatively highly doped second conductivity type nonmonocrystalline silicon gate region 28 (shown as P+) having a doping concentration greater than about $5 \times 10^{18}$ cm$^{-3}$ therein. The gate regions 28 may even be degenerately doped. In particular, the gate regions 28 preferably comprise a material selected from the group consisting of polycrystalline silicon or amorphous silicon. As illustrated, the gate regions 28 are not electrically insulated from the drift region 16, but instead form rectifying P-N heterojunctions with the drift region 16 at the sidewalls 22a and bottoms of the trenches 22. An electrically insulating layer 26, preferably comprising thermally grown silicon dioxide ($SiO_2$) or polyimide, is also provided on the nonmonocrystalline silicon gate regions 28 in order to electrically isolate the gate regions 28 from a source electrode 32 (e.g., titanium) which ohmically contacts the source region 20 at the second face 12b. As explained more fully hereinbelow, a gate electrode 36 which ohmically contacts the gate regions 28 through openings or vias in the electrically insulating layer 26 (shown by dotted lines) may also be provided. Similarly, a drain electrode 34 (e.g., titanium) is provided at the first face 12a, in ohmic contact with the drain region 14.

In the static-induction transistor unit cells 11 of FIG. 1, forward current in the vertical direction from the drain region 14 to the source region 20 is controlled by the height of an electrostatically induced potential energy barrier in the mesas 24. This electrostatic barrier develops at pinch-off when opposing depletion layers converge to completely deplete the mesas 24 of mobile charge carriers. Moreover, if the P-N heterojunctions formed by the nonmonocrystalline silicon gate regions 28 and the drift region 16 are sufficiently reversed biased by application of a large negative gate bias, the opposing depletion layers will also extend into the portion of the drift region 16 extending below the gate regions 28 and mesas 24. Under these conditions, a large drain bias can be supported by the higher electrostatic barrier induced in the drift region 16.

The drift region 16 is preferably relatively lightly doped at a level less than about $5 \times 10^{16}$ cm$^{-3}$ to withstand application of a large drain-to-gate voltage and permit high forward blocking voltage capability. In one possible mode of operation, the mesas 24 may be depleted of charge carriers when the gate regions 28 are at zero potential bias relative to the mesas 24. Under these circumstances, the static-induction transistor unit cells 11 are normally-off and application of a gate bias is needed before a drain-to-source current will flow. However, to maximize the forward current densities, the drift region 16 is preferably doped to sufficient levels so that the mesas 24 will not be fully depleted under zero gate bias and the unit cells 11 will be normally-on. As will be understood by those skilled in the art, the doping concentrations in the drift region 16 and gate regions 28 and the width Wm of the mesas 24 influence whether full depletion of the mesas 24 will occur at zero potential gate bias, as more fully described in commonly assigned U.S. Pat. No. 5,323,040 to Baliga, the disclosure of which is hereby incorporated herein by reference.

Figure 2:
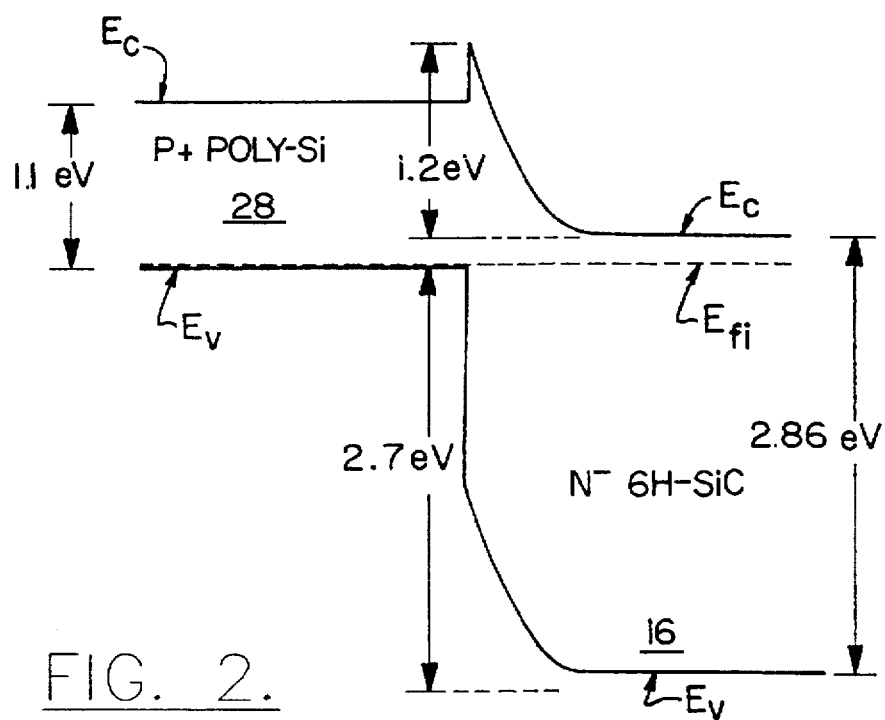
FIG. 2 illustrates an energy band diagram for a rectifying heterojunction between P+ polycrystalline silicon and N-6H—SiC.

Referring now to FIG. 2, a band diagram of the P-N heterojunction formed between a P+ polycrystalline silicon gate region 28, having a boron (B) doping concentration of about $1 \times 10^{19}$ cm$^{-3}$ therein, and the 6H—SiC drift region 16 (in the mesa 24) having an N-type doping concentration of about $1 \times 10^{16}$ cm$^{-3}$, is illustrated. As shown by the band diagram, the potential barrier for electrons in the drift region 16 is only about 1.2 eV so the forward voltage drop of the diode formed by the P-N heterojunction will be low. However, the potential barrier for holes in the P+ polycrystalline silicon gate region 28 is not equal to the potential barrier for electrons, but is actually greater than the potential barrier for the electrons, at 2.7 eV. Thus, during the flyback mode of operation, there will be negligible hole injection from the P+ polycrystalline silicon gate region 28 into the N– drift region 16 relative to the amount of electron injection from the N– drift region 16 into the P+ polycrystalline silicon gate region 28. To limit the amount of hole injection, the potential barrier for holes should be preferably maintained at a level at least 0.5 eV greater than the potential barrier for electrons. As will be understood by those skilled in the art, the reduction or elimination of hole injection into the drift region 16 significantly improves the switching speed of the static-induction transistor by reducing the amount of stored charge in the drift region 16. Accordingly, the present invention achieves an unexpected advantageous result of limiting conduction in a P$^+$-N$^-$ junction diode to a single carrier type (electrons), even though the P-type region is doped at levels more that two orders of magnitude greater than the N-type region. In other words, even though an abrupt one-sided P$^+$-N$^-$ junction is typically dominated by conduction of holes, the present invention utilizes an abrupt one-sided P$^+$-N$^-$ heterojunction to achieve a reverse flyback current dominated by electrons. Moreover, this benefit is achieved without the aforementioned limitations associated with metal gate electrodes.

Referring again to FIG. 1, the power device 10 may also comprise a substrate formed of any one of a number of other suitable wide bandgap semiconductor materials besides silicon carbide which have bandgaps ($E_g = E_c - E_v$) greater than 1.5 eV. Typical wide bandgap semiconductor materials include: diamond, IV-IV carbides such as $Si_xGe_yC_{1-x-y}$; III-V nitrides and phosphides such as cubic BN, CN, GaN, BP, $GaAs_{1-x}P_x$ (x=0.1→1) and $Al_xGa_{1-x}N_yP_{1-y}$; II-VI selenides, tellurides, oxides and sulfides such as $Zn_xCd_{1-x}S_ySe_{1-y}$, CdSe, CdS, ZnS, CdTe and ZnO. The suitability of these semiconductor materials for many electronic device applications is more fully described in U.S. Pat. No. 5,536,953 to Dreifus et al. entitled Wide Bandgap Semiconductor Device Including Lightly Doped Active Region. To limit hole injection during conduction of the reverse P$^+$-N$^-$ flyback diode, the gate region is preferably formed of a semiconductor material having a bandgap less than 1.5 eV. In particular, gate regions comprised of narrow bandgap materials should be selected so that the potential barrier for second conductivity type charge carriers (e.g., holes) at the P-N junction is greater than the potential barrier for first conductivity type charge carriers (e.g., electrons) by at least 0.5 eV, as explained more fully hereinabove. Under this criteria, 3C—SiC which has a bandgap of about 2.2 eV may also be considered as a potential gate region material if the wide bandgap material used to form the drift region has a sufficiently large bandgap energy (e.g., 4H—SiC ($E_g \approx 3.2$ eV)).

Referring now to FIGS. 3A–3F, a preferred method of forming the static-induction transistor of FIG. 1 will be described. The method includes the steps of providing an N+ 6H—SiC wafer 114 having a resistivity of about 0.001 Ohm-cm and a thickness of about 200–400 μm. A relatively lightly doped N-type layer 116 of silicon carbide, having a doping concentration of about $1 \times 10^{16}$ cm$^{-3}$ and a thickness of about 10 μm, is then deposited on the wafer 114 using vapor phase epitaxy (VPE), to form a silicon carbide substrate 112. A source region 120 of first conductivity type is then formed at the second face of the substrate by implanting nitrogen ions at a dose of about $1 \times 10^{15}$ cm$^{-2}$ and an energy of about 50 KeV. The source region 120 may be formed to have a thickness of about 0.2 μm, for example.

Figure 3A:
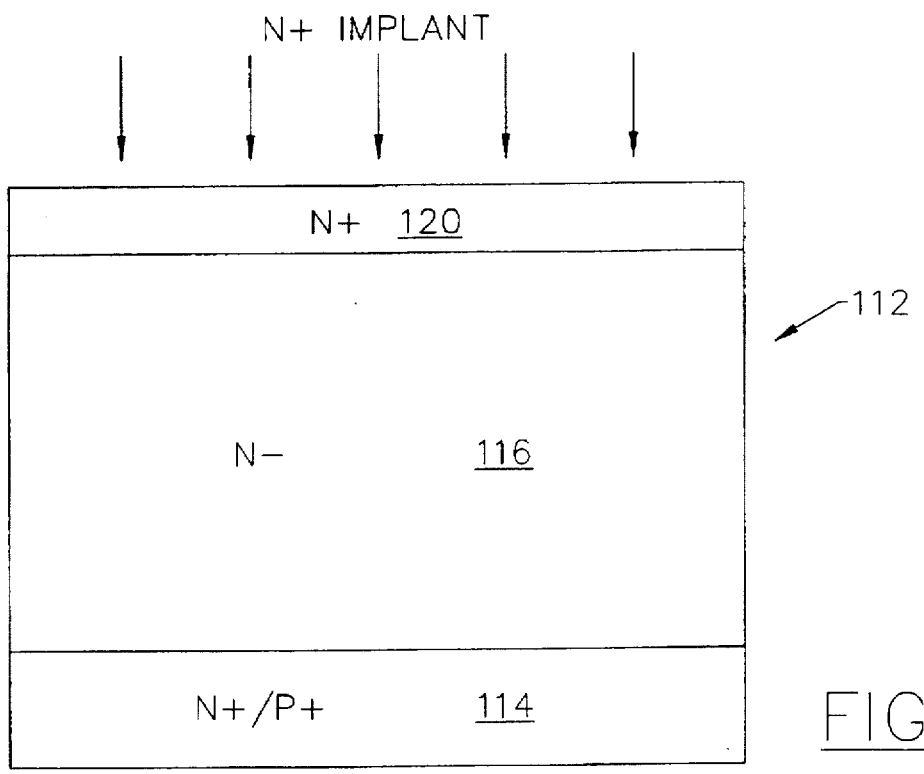
FIGS. 3A–3F illustrate schematic cross-sectional views of intermediate structures illustrating a method of forming an integrated heterojunction-gate static-induction switching device, according to the present invention.
Figure 3B:
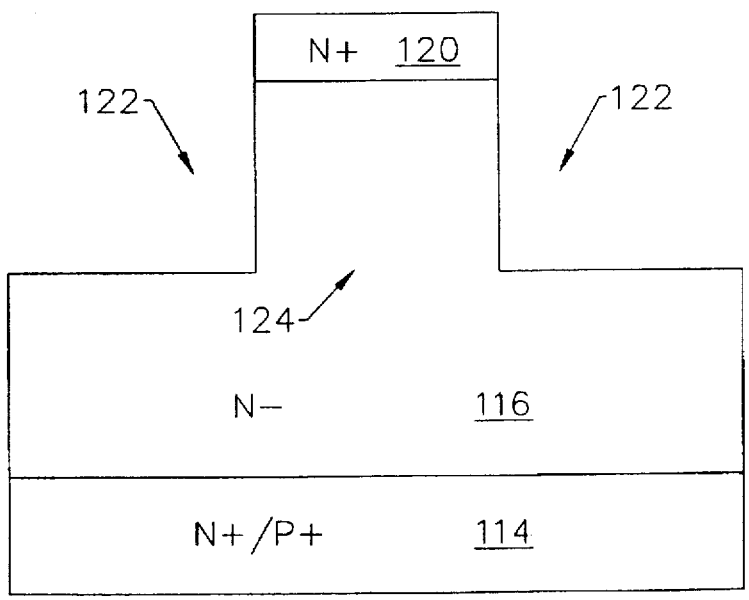

Using a mask, a reactive ion etching (RIE) step is then performed to form a plurality of parallel stripe-shaped trenches 122, as illustrated best by FIG. 3B. This is the only step in the preferred method which may require relatively high resolution photolithography, as will be understood by those skilled in the art. Each pair of these trenches defines a mesa 124 therebetween. One such technique for forming trenches in silicon carbide is described in an article by M. Kothandaraman et al. entitled Reactive Ion Etching of Trenches in 6H—SiC, jour. of Elec. Mat., Vol. 25, No. 5, pp. 875–878 (1996), the disclosure of which is hereby incorporated herein by reference. Another technique for forming trenches in silicon carbide is described in U.S. Pat. No. 5,436,174 to Baliga et al., entitled Method of Forming Trenches in Monocrystalline Silicon Carbide, the disclosure of which is hereby incorporated herein by reference.

Figure 3C:
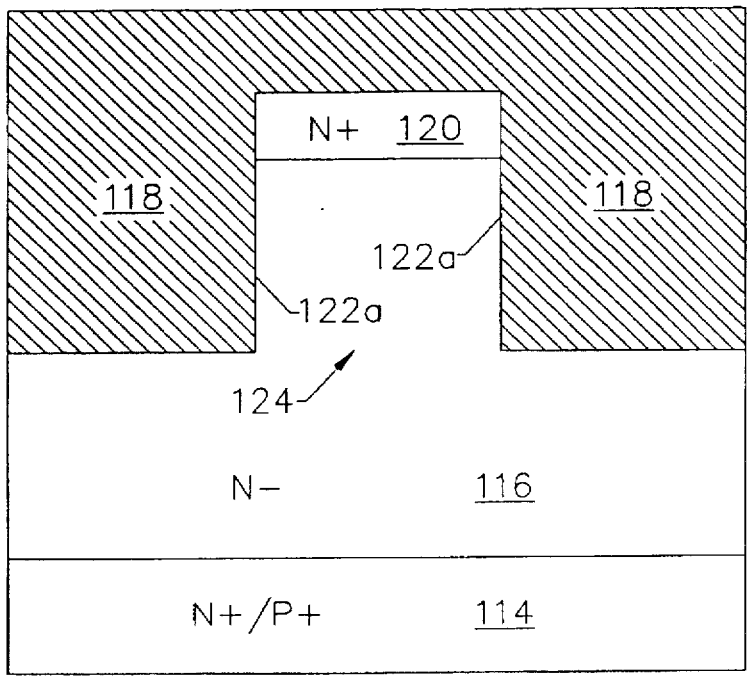
Figure 3D:
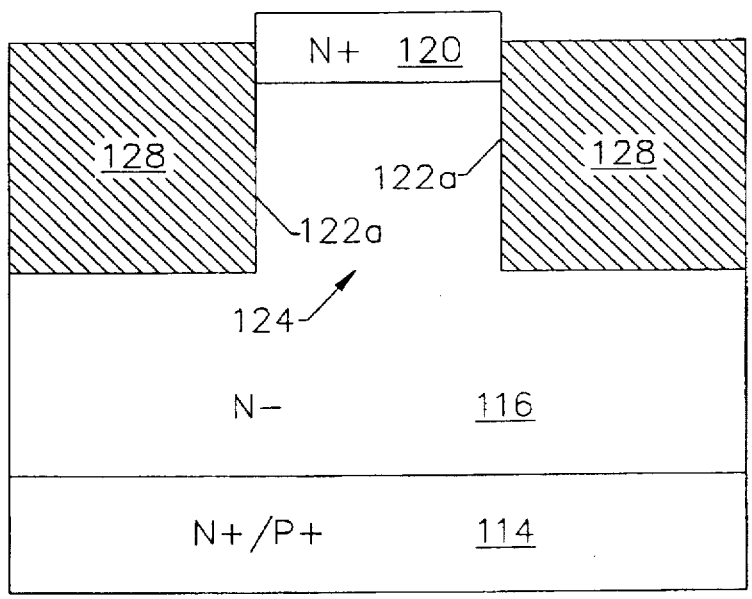
Figure 3E:
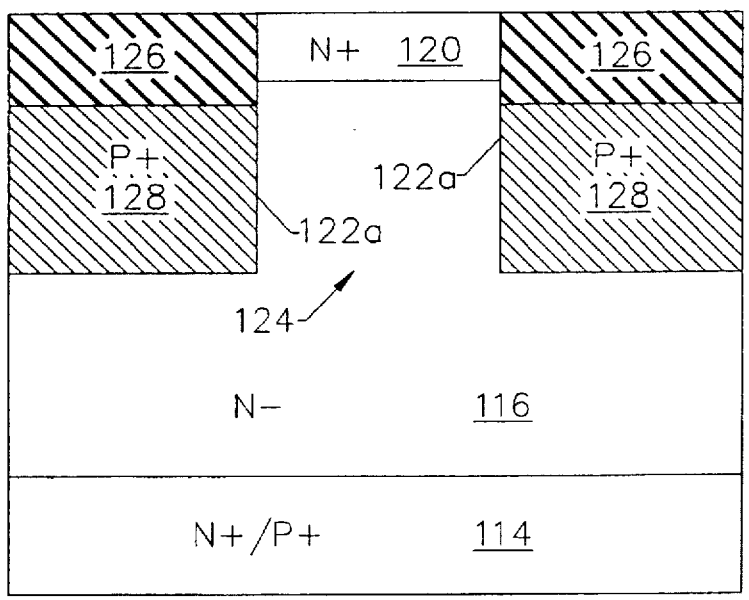
Figure 3F:
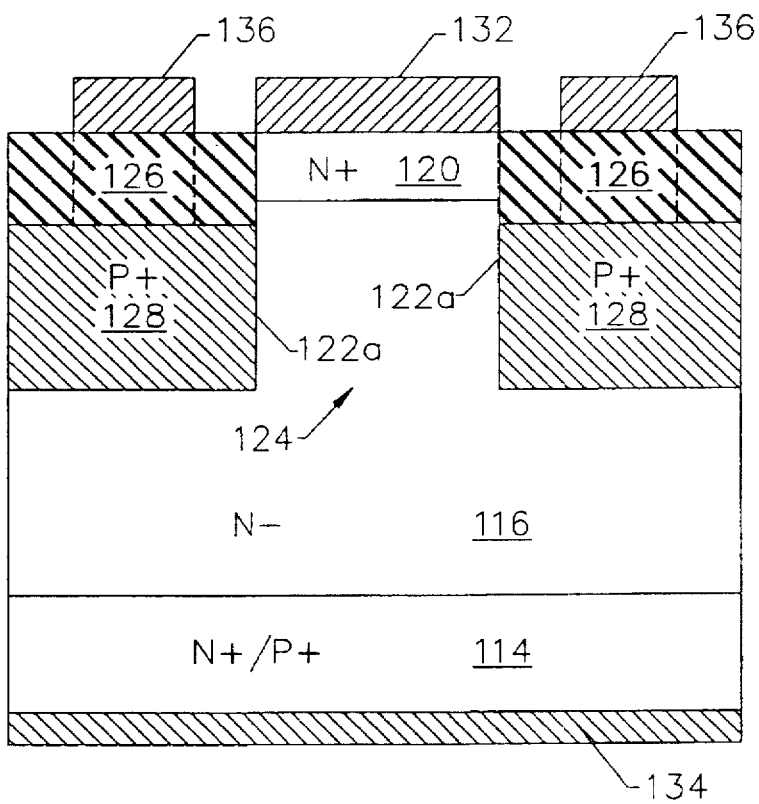

Referring now to FIG. 3C, a polycrystalline (or amorphous) silicon layer 118 of second conductivity type is then conformally deposited onto the sidewalls of the trenches 122 and on the top surface of the substrate. The polycrystalline silicon layer 118 may be doped with a suitable P-type dopant such as boron (B) to a level of about $1 \times 10^{19}$ cm$^{-3}$. The polycrystalline silicon layer 118 is then planarized to form separate gate regions 128 by exposing the top surface of the substrate and upper portions of the sidewalls of the trenches 122, as illustrated best by FIG. 3D. The step of planarizing the polycrystalline silicon layer may be performed by a reactive ion etching (RIE) step or combination of RIE and chemical mechanical polishing (CMP) steps, as will be understood by those skilled in the art. Referring now to FIG. 3E, the different oxidation rates of polycrystalline silicon and silicon carbide are then used advantageously during the formation of a relatively thick thermally grown oxide 126 (e.g. SiO$_2$) on the polycrystalline gate regions 128 and a relatively thin thermally grown oxide on the source regions 120. The oxidation selectivity of polycrystalline silicon relative to silicon carbide is more fully described in an article by T. I. Kamins entitled Oxidation of Phosphorus-Doped Low Pressure and Atmospheric Pressure CVD Polycrystalline-Silicon Films, Jour. Electrochem. Soc., Solid-State Science and Technology, pp. 838–844, May (1979), the disclosure of which is hereby incorporated herein by reference. During this step, second conductivity type dopants in the polycrystalline silicon become incorporated into the relatively thick thermally grown oxide as the polycrystalline silicon is consumed. A blanket reactive ion etching (RIE) step is then performed to remove the thin oxide on the source regions 120. Contact windows are then etched into the oxide covering the polycrystalline silicon gate regions 128 and then metallization (e.g., titanium) is applied to both faces and then patterned to form separate gate, source and drain electrodes 136, 132 and 134, respectively, as illustrated by FIG. 3F.

Two-dimensional simulations of the device of FIG. 1 reveal a blocking voltage capability of 1140 Volts can be obtained for a heterojunction-gate static-induction transistor (SIT) having the parameters as set forth in Table 1. This blocking voltage was achieved at a gate-to-source bias of −25 Volts. The preferred SIT also achieved a low forward voltage drop of 0.08 Volts at a current density of 100 A/cm$^2$, which indicates a specific on-resistance of only 0.8 milliOhms-cm$^2$. Although not wishing to be bound by any theory, this extremely high forward blocking voltage capability of 1140 Volts is believed to be due, in part, to the nonmonocrystalline lattice structure of the gate region. In particular, the reverse breakdown voltage of the P$^+$-N$^-$ heterojunction can be maintained at a high level because the nonmonocrystalline lattice structure of the gate material provides numerous grain boundaries and other lattice defects which act as scattering sites for electrons. Under reverse bias of the heterojunction, these scattering sites act to deflect and partially absorb the energy of electrons which are being accelerated under the influence of the reverse potential field across the heterojunction. Thus, by providing scattering sites, the probability that accelerated electrons will reach the threshold energy to induce avalanche breakdown is reduced. Steps to increase the density of scattering sites can also include implanting electrically inactive ions into the gate regions to increase the density of intersitial lattice defects.

TABLE 1

| Region | Composition | $N_D$ | Thickness/ Depth | Width (Unit Cell) |
|---|---|---|---|---|
| 14 Drain | N + SiC | $2 \times 10^{18}$ | 300 microns | 4 microns |
| 16 Drift | N − SiC | $1 \times 10^{16}$ | 9.8 microns | — |
| 20 Source | N + SiC | $1 \times 10^{20}$ | 0.2 micron | 2 microns |
| 22 Trench | — | — | 3 microns | 2 microns |
| 24 Mesa | SiC | — | 3 microns | 2 microns |
| 26 Insulating | SiO$_2$ | — | 1 micron | 2 microns |
| 28 Gate region | P + Poly-Si | $1 \times 10^{19}$ | 2 microns | 2 microns |
| 32 Source Electrode | Titanium | — | 1 micron | — |
| 34 Drain Electrode | Titanium | — | 1 micron | — |

As will be understood by those skilled in the art, the statiction induction transistor of the present invention may be coupled with a silicon power MOSFET to achieve a composite switch having excellent on-state, current saturation and safe-operating-area (SOA) characteristics. For example, the static-induction transistor of the present invention may be substituted for the silicon carbide field effect transistor disclosed in the aforementioned commonly assigned U.S. Pat. No. 5,396,085 to Baliga, entitled Silicon Carbide Switching Device with Rectifying-Gate. Simulations of the static-induction transistor as a composite switch show an on-state voltage drop across the heterojunction flyback diode of 1.1 Volts at a current density of 100 A/cm$^2$. These simulation results were obtained for a static-induction transistor having a cross-section as illustrated by FIG. 1 and the parameters of Table 1. Simulations under these conditions also illustrate a hole concentration of less than about $1 \times 10^{-12}$ cm$^{-3}$ at a current density of 100 A/cm$^2$, because of the high potential barrier for holes at the P-N heterojunction. This low hole concentration in the drift region results in high switching speed and reduced power losses, as more fully described hereinabove.

In the drawings and specification, there have been disclosed typical preferred embodiments of the invention and, That which is claimed is:

1. A heterojunction-gate static-induction transistor, comprising:

a monocrystalline silicon carbide substrate having first and second opposing faces thereon and containing therein a silicon carbide drain region of first or second conductivity type adjacent the first face, a silicon carbide source region of first conductivity type adjacent the second face and a silicon carbide drift region of first conductivity type between said silicon carbide source and drain regions, said silicon carbide drift region having a lower first conductivity type doping concentration therein than said silicon carbide source region:

a first trench in said silicon carbide substrate at the second face, said first trench having a first sidewall extending adjacent said silicon carbide drift region;

a first nonmonocrystalline silicon gate region of second conductivity type in said first trench, said first nonmonocrystalline silicon gate region forming a P-N heterojunction with said silicon carbide drift region at the first sidewall of said first trench:

source and drain electrodes ohmically contacting said source and drain regions, respectively: and a thermally grown silicon dioxide insulating region in said first trench, between said first nonmonocrystalline silicon gate region and said source electrode:

wherein a first conductivity type doping concentration in said silicon carbide drift region is less than about $5 \times 10^{16}$ cm$^{-3}$ and wherein a second conductivity type doping concentration in said first nonmonocrystalline silicon gate region is greater than about $5 \times 10^{18}$ cm$^{-3}$; and wherein said thermally grown silicon dioxide insulating region comprises second conductivity type dopants therein.

2. An integrated silicon carbide switching device, comprising:

a silicon carbide substrate having first and second opposing faces thereon;

a silicon carbide drain region of first or second conductivity type in said silicon carbide substrate, adjacent the first face;

a silicon carbide source region of first conductivity type in said silicon carbide substrate, adjacent the second face;

a silicon carbide drift region of first conductivity type in said silicon carbide substrate said silicon carbide drift region extending between said silicon carbide source and drain regions;

a plurality of spaced trenches in said silicon carbide substrate at the second face, said trenches having respective sidewalls extending adjacent said silicon carbide drift region;

a nonmonocrystalline silicon gate region of second conductivity type in each of said plurality of spaced trenches, said nonmonocrystalline silicon gate regions forming respective P-N heterojunctions with said silicon carbide drift region at the sidewalls of said plurality of spaced trenches and comprising a material which is selected from the group consisting of amorphous silicon and polycrystalline silicon;

source and drain electrodes ohmically contacting said source and drain regions, respectively; and a thermally grown silicon dioxide insulating region in each of said plurality of trenches, said thermally grown silicon dioxide regions extending between respective nonmonocrystalline silicon gate regions and said source electrode:

wherein a potential barrier for second conductivity type charge carriers at the P-N heterojunctions is greater than a potential barrier for first conductivity type charge carriers by more than about 0.5 eV; and wherein said thermally grown silicon dioxide insulating region comprises second conductivity type dopants therein.

3. A silicon carbide static-induction transistor, comprising:

a 4H or 6H monocrystalline silicon carbide substrate having first and second opposing faces thereon and containing therein a silicon carbide drain region of first or second conductivity type adjacent the first face, a silicon carbide source region of first conductivity type adjacent the second face and a silicon carbide drift region of first conductivity type between said source and drain regions, said drift region having a lower first conductivity type doping concentration therein than said source region;

a trench in said silicon carbide substrate at the second face, said trench having a sidewall extending adjacent said drift region; and a gate region of second conductivity type in said trench, said gate region comprising 3C nonmonocrystalline silicon carbide and forming a P-N junction with said drift region at the sidewall of said trench.

4. The static-induction transistor of claim 3, wherein a potential barrier for second conductivity type charge carriers at the P-N junction is greater than a potential barrier for first conductivity type charge carriers by more than about 0.5 eV.

5. The static-induction transistor of claim 4, further comprising source and drain electrodes ohmically contacting said source and drain regions, respectively; and polyimide in said trench, between said gate region and said source electrode.

* * * * *